(12) United States Patent
Ohkuma et al.

(10) Patent No.: US 8,212,974 B2
(45) Date of Patent: Jul. 3, 2012

(54) BLUE COLOR COMPOSITION CONTAINING DYE, COLOR FILTER AND LIQUID CRYSTAL DISPLAY DEVICE AND ORGANIC EL DISPLAY PROVIDED WITH THE COLOR FILTER

(75) Inventors: Satoshi Ohkuma, Tokyo (JP); Noriko Asahi, Tokyo (JP); Takashi Yamauchi, Tokyo (JP); Yasuyuki Demachi, Tokyo (JP); Takaaki Kurata, Tokyo (JP); Yutaka Ishii, Kawaguchi (JP); Yoshiki Akatani, Saitama (JP)

(73) Assignees: Toppan Printing Co., Ltd., Tokyo (JP); Nippon Kayaku Kabushiki Kaisha, Tokyo (JP)

( * ) Notice: Subject to any disclaimer, the term of this patent is extended or adjusted under 35 U.S.C. 154(b) by 253 days.

(21) Appl. No.: 12/662,554

(22) Filed: Apr. 22, 2010

(65) Prior Publication Data

US 2010/0271578 A1  Oct. 28, 2010

(30) Foreign Application Priority Data

Apr. 24, 2009 (JP) ................. 2009-106187

(51) Int. Cl.
 *G02F 1/13335* (2006.01)
(52) U.S. Cl. ...................................... 349/106
(58) Field of Classification Search ........... 349/106
 See application file for complete search history.

(56) References Cited

U.S. PATENT DOCUMENTS

| | | |
|---|---|---|
| 4,808,501 A | 2/1989 | Chiulli |
| 5,059,500 A | 10/1991 | Needham et al. |
| 5,667,902 A | 9/1997 | Brew et al. |

(Continued)

FOREIGN PATENT DOCUMENTS

JP  1-94301  4/1989

(Continued)

*Primary Examiner* — Sung Pak

(57) ABSTRACT

Disclosed is a dye-containing blue color composition for color filter, including a triarylmethane-based dye having a structure represented by the following formula (1):

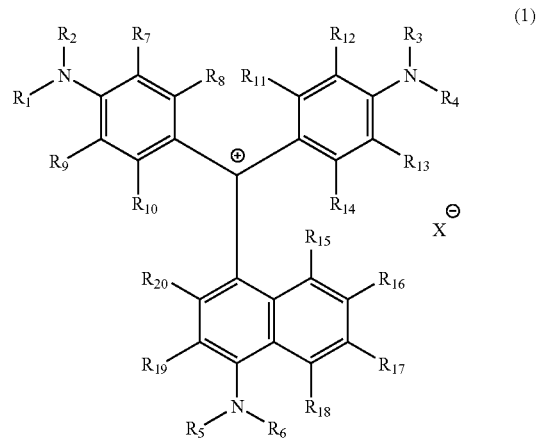

wherein $R_1$, $R_2$, $R_3$, $R_4$, $R_5$ and $R_6$ each independently represent a hydrogen atom, an alkyl group having 1 to 6 carbon atoms which may have a substituent, a phenyl group which may have a substituent or a benzyl group which may have a substituent, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ each independently represent a hydrogen atom, an alkyl group having 1 to 6 carbon atoms which may have a substituent or a halogen atom and X represents a tristrifluoromethanesulfonylmethide anion.

9 Claims, 2 Drawing Sheets

U.S. PATENT DOCUMENTS

| | | | |
|---|---|---|---|
| 2010/0317819 A1* | 12/2010 | De Keyzer et al. | 528/33 |
| 2011/0049444 A1* | 3/2011 | Sako et al. | 252/586 |

FOREIGN PATENT DOCUMENTS

| | | |
|---|---|---|
| JP | 64-90403 | 4/1989 |
| JP | 64-91102 | 4/1989 |
| JP | 5-333207 | 12/1993 |
| JP | 6-11614 | 1/1994 |
| JP | 6-35183 | 2/1994 |
| JP | 6-51115 | 2/1994 |
| JP | 6-194828 | 7/1994 |
| JP | 2592207 | 12/1996 |
| JP | 11-223720 | 8/1999 |
| JP | 2008-304766 | 12/2008 |
| JP | 2011186043 A * | 9/2011 |

* cited by examiner

F I G. 1

F I G. 2

F I G. 3A

F I G. 3B

F I G. 3C

BLUE COLOR COMPOSITION CONTAINING DYE, COLOR FILTER AND LIQUID CRYSTAL DISPLAY DEVICE AND ORGANIC EL DISPLAY PROVIDED WITH THE COLOR FILTER

CROSS-REFERENCE TO RELATED APPLICATIONS

This application is based upon and claims the benefit of priority from prior Japanese Patent Application No. 2009-106187, filed Apr. 24, 2009, the entire contents of which are incorporated herein by reference.

BACKGROUND OF THE INVENTION

1. Field of the Invention

The present invention relates to a blue color composition containing a dye, a color filter, and a liquid crystal display device and an organic EL display device each including the color filter.

2. Description of the Related Art

A liquid crystal display device has recently come to be valuable for its space saving and light-weight properties thanks to its thin configuration and also for power saving properties. Particularly, these liquid crystal display devices have been rapidly spread in display applications including a television receiver. It is therefore desired that these liquid crystal display devices are more improved in display performances such as brightness, contrast and omnidirectional visibility. It is also desired to develop liquid crystal display devices provided with color filters having higher brightness and higher contrast.

Blue pigments such as C.I. Pigment Blue 15:6, C.I. Pigment Blue 15:3 and C.I. Pigment Violet 23 have been used for the blue filter segment constituting the color filter. These pigments have high heat resistance, light fastness and dispersibility and are therefore frequently used for color filters. However, these pigments are limited in the improvement of transmittance due to their spectral characteristics. These pigments are also limited in the improvement of contrast due to the depolarization specific to these pigments.

In the meantime, it is proposed to use dyes in place of pigments as coloring materials because the dyes have a high transmittance. In this case, triarylmethane-based dyes have the characteristics that they are very distinctive and have high color developing ability and are known as coloring materials for violet and blue colors. However, they have the drawbacks in that they are inferior in robustness including light fastness, heat resistance and hygrothermal resistance.

JP-A 11-223720 discloses a color filter formulated with a metal complex to improve the light fastness of a triarylmethane-based acid dye. However, it has been found by the studies made by the present inventors that this color filter still has unsatisfactory light fastness and hygrothermal resistance. Also, JP-A 2008-304766 discloses a salt of a cationic triaryl compound and Cl⁻ or $ArSO^{3-}$. However, the present inventors have made studies concerning this color filter and as a result, found that this triarylmethane compound also has unsatisfactory light fastness and hygrothermal resistance.

BRIEF SUMMARY OF THE INVENTION

It is an object of the present invention to provide a dye-containing blue color composition for color filter which is excellent in heat resistance and light fastness, a color filter using this blue color composition, and a liquid crystal display device and an EL display device each including this color filter.

According to a first aspect of the present invention, there is provided a dye-containing blue color composition for color filter, comprising a triarylmethane-based dye having a structure represented by the following formula (1):

wherein $R_1$, $R_2$, $R_3$, $R_4$, $R_5$ and $R_6$ each independently represent a hydrogen atom, an alkyl group having 1 to 6 carbon atoms which may have a substituent, a phenyl group which may have a substituent or a benzyl group which may have a substituent, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ each independently represent a hydrogen atom, an alkyl group having 1 to 6 carbon atoms which may have a substituent or a halogen atom and X represents a tristrifluoromethanesulfonylmethide anion.

According to a second aspect of the present invention, there is provided a color filter comprising a blue pixel obtained by curing the dye-containing blue color composition according to the first aspect of the present invention.

According to a third aspect of the present invention, there is provided a liquid crystal display device comprising the color filter according to the second aspect of the present invention.

According to a fourth aspect of the present invention, there is provided an organic EL display device comprising the color filter according to the second aspect of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Various embodiments of the present invention will be explained.

A blue color composition according to a first embodiment of the present invention contains a triarylmethane-based dye having a structure represented by the following formula (1):

wherein $R_1$, $R_2$, $R_3$, $R_4$, $R_5$ and $R_6$ each independently represent a hydrogen atom, an alkyl group having 1 to 6 carbon atoms which may have a substituent, a phenyl group which may have a substituent or a benzyl group which may have a substituent, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ each independently represent a hydrogen atom, an alkyl group having 1 to 6 carbon atoms which may have a substituent or a halogen atom and X represents a tristrifluoromethanesulfonylmethide anion.

In $R_1$, $R_2$, $R_3$, $R_4$, $R_5$ and $R_6$ in the formula (1), examples of the alkyl group having 1 to 6 carbon atoms which may have a substituent include a methyl group, ethyl group, propyl group, butyl group, isobutyl group, pentyl group, cyclopentyl group, hexyl group, cyclohexyl group, hydroxyethyl group, hydroxypropyl group, 2-sulfoethyl group, carboxyethyl group, cyanoethyl group, methoxyethyl group, ethoxyethyl group, butoxyethyl group, trifluoromethyl group and pentafluoroethyl group.

In $R_1$, $R_2$, $R_3$, $R_4$, $R_5$ and $R_6$ in the formula (1), examples of the substituent of the phenyl group or benzyl group which may have a substituent include (C1 to C5) alkyl groups such as a methyl group, ethyl group, propyl group, isopropyl group, butyl group, t-butyl group and pentyl group, halogen atoms such as a fluorine atom, chlorine atom, bromine atom and iodine atom, sulfonic acid group, (C1 to C6) alkoxy groups such as a methoxy group, ethoxy group, propoxy group, butoxy group, t-butoxy group and hexyloxy group, hydroxy (C1 to C5) alkyl groups such as a hydroxyethyl group and hydroxypropyl group, (C1 to C5) alkoxy (C1 to C5) alkyl groups such as a methoxyethyl group, ethoxyethyl group, ethoxypropyl group and butoxyethyl group, hydroxy (C1 to C5) alkoxy group such as a 2-hydroxyethoxy group, alkoxy (C1 to C5) alkoxy groups such as a 2-methoxyethoxy group and 2-ethoxyethoxy group, 2-sulfoethyl group, carboxyethyl group and cyanoethyl group.

As $R_1$, $R_2$, $R_3$, $R_4$, $R_5$ and $R_6$ in the formula (1), a hydrogen atom, unsubstituted alky groups having 1 to 6 carbon atoms, unsubstituted phenyl groups or unsubstituted benzyl groups are preferable.

In $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ in the formula (1), examples of the alkyl group having 1 to 6 carbon atoms which may have a substituent include a methyl group, ethyl group, propyl group, butyl group, isobutyl group, pentyl group, cyclopentyl group, hexyl group, cyclohexyl group, hydroxyethyl group, hydroxypropyl group, 2-sulfoethyl group, carboxyethyl group, cyanoethyl group, methoxyethyl group, ethoxyethyl group, butoxyethyl group, trifluoromethyl group and pentafluoroethyl group.

In $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ in the formula (1), examples of the halogen atom include fluorine, chlorine, bromine and iodine.

As $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ in the formula (1), a hydrogen atom, chlorine atom or unsubstituted alkyl groups having 1 to 6 carbon atoms are preferable.

The triarylmethane compound to be used in the blue color composition according to this embodiment is obtained by a known synthetic method described in Yutaka HOSODA "THEORETICAL PRODUCTION DYE CHEMISTRY" (pp. 781-787), published from GIHODO SHUPPAN Co., Ltd. It may also be synthesized by using a commercially available product containing a chlorine anion as the above X and by adding a corresponding salt or acid to carry out salt exchange.

The mass concentration of the triarylmethane-based dye explained as above in the blue color composition is preferably 0.1% to 20%, more preferably 0.5% to 18% and still more preferably 0.5% to 15%. When the concentration of the triarylmethane-based dye is less than 0.1%, it is necessary to considerably increase the thickness of a color pixel film in order to form sufficiently colored pixels required for a color filter because the concentration of the dye is low, and it is therefore difficult to form a pixel and the productivity is impaired, posing a problem as to practical use. When the concentration of the dye exceeds 20%, the dye is insufficiently dissolved and there is therefore a fear as to the precipitation of crystals because the concentration is too high. Moreover, there is also a fear concerning the precipitation of the dye when the blue color composition is applied to a substrate and organic solvents are dried for forming a color pixel.

The blue color composition according to this embodiment may include, besides the foregoing triarylmethane-based dye, other dyes and pigments. Any dye may be used as the other dyes which may be contained without any particular limitation as long as it is soluble in an organic solvent. For example, blue dyes such as triarylmethane-based dyes having structures other than the above structures and anthraquinone-based dyes may be used. Also, although any pigment may be used as the pigment which may be contained, pigments such as C.I. Pigment Blue 15:6, C.I. Pigment Blue 15:3 and C.I. Pigment Violet 23 are preferable.

The mass concentration of the colorants including the above other dyes and pigments in the blue color composition is preferably 0.1% to 50%, more preferably 0.5% to 40% and still more preferably 0.5% to 30%. When the concentration is less than 0.1%, the concentration of the dye is low. Therefore, it is necessary to considerably increase the thickness of a color pixel film in order to form sufficiently colored pixels required for a color filter, and it may be therefore difficult to form a pixel and the productivity may be impaired, posing a problem as to practical use. When the concentration exceeds 50%, on the other hand, the amount of the resin required to disperse the pigments is reduced, and therefore the composition may be unstable, causing the coagulation of the pigments, resulting in increasing in viscosity of the composition and deterioration in contrast.

Examples of the dyes which are soluble in organic solvents and may be mixed in the triarylmethane-based dye upon use include dyes which have been known in color filter applications. Examples of the above known dyes include those described in, for example, JP-A 64-90403, JP-A 64-91102, JP-A 1-94301 and JP-A 6-11614, Japanese Patent No. 2592207, U.S. Pat. Nos. 4,808,501, 5,667,920 and 5,059,500 and JP-A 5-333207, JP-A 6-35183, JP-A 6-51115 and JP-A 6-194828.

Examples of the dye which may be used as the dye soluble in an organic solvent include triarylmethane-based, anthraquinone-based, benzylidene-based, oxonol-based, cyanine-based, phenothiazine-based, pyrrolopyrazole azomethine-based, xanthenes-based, phthalocyanine-based, benzopyran-based and indigo-based dyes.

The dye soluble in an organic solvent is particularly preferably dyes such as pyrazole-based dyes, anilinoazo-based dyes, pyrazolotriazole azo-based dyes, pyridone azo-based dyes, anthraquinone-based dyes and anthrapyridone-based dyes. Particularly, anthraquinone-based dyes such as C.I. Solvent Blue 35 are preferable.

Also, in the case of the resist-based dyes developed by water or an alkali, an acid dye and/or its derivative may preferably be used as the dye soluble in an organic solvent from the viewpoint of completely removing a binder and/or a dye at the time of developing. Other than the above, a direct dye, basic dye, mordant dye, acidic mordant dye, azoic dye, disperse dye, oil-soluble dye, food dye and/or their derivatives can also be preferably used as the dye soluble in organic solvents.

The acid dye or its derivatives usable as the dyes soluble in an organic solvent will be described below.

As the acid dye, a proper dye is selected in consideration of all of the performances required for the dye such as solubility in an organic solvent and developing solution, the ability to form a salt with a basic compound, absorbance, the interaction with other components in the curable composition, light fastness and heat resistance, although any dye may be used as the acid dye without any particular limitation as long as it is a dye having an acid group such as a sulfonic acid group, carboxyl group or phenolic hydroxyl group.

Specific examples of the acid dye include, but are not limited to, acid alizarin violet N; C.I. acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340; C.I. acid chrome violet K; C.I. acid violet 6B, 7, 9, 17, 19; C.I. Direct Violet 47, 52, 54, 59, 60, 65, 66, 79, 80, 81, 82, 84, 89, 90, 93, 95, 96, 103, 104; C.I. Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293; C.I. Direct Green 25, 27, 31, 32, 34, 37, 63, 65, 66, 67, 68, 69, 72, 77, 79, 82; C.I. Mordant Violet 2, 4, 5, 7, 14, 22, 24, 30, 31, 32, 37, 40, 41, 44, 45, 47, 48, 53, 58; C.I. Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84; C.I. Mordant Green 1, 3, 4, 5, 10, 15, 19, 26, 29, 33, 34, 35, 41, 43, 53; and derivatives of these dyes.

Among the above acid dyes, dyes such as C.I. acid blue 23, 25, 29, 62, 80, 86, 87, 92, 138, 158, 182, 243, 324:1; C.I. acid violet 7; and derivatives of these dyes are preferable.

Also, other than the above dyes, azo-based, xanthene-based or phthalocyanine-based acid dyes are preferable and acid dyes such as C.I. Solvent Blue 44, 38; or derivatives of these acid dyes can be preferably used.

As the above acid dye derivative, inorganic salts of acid dyes having an acid group such as sulfonic acid or carboxylic acid, salts of acid dyes and nitrogen-containing compounds and sulfonamide analogues of acid dyes may be used. As the acid dye derivative, a proper dye derivative is selected in consideration of all of the performances required for the dye such as solubility in an organic solvent and developing solution, absorbance, the interaction with other components in the curable composition, light fastness and heat resistance, although any dye derivative may be used as the acid dye without any particular limitation as long as it is a dye soluble in the solution of the curable composition.

There is the case where the above method of forming a salt of an acid dye and a nitrogen-containing compound is effective to improve the solubility (solubility in organic solvents) of the acid dye and also to improve the heat resistance and light fastness of the acid dye. Here, a nitrogen-containing compound which reacts with an acid dye to form a salt and a nitrogen-containing compound which reacts with an acid dye to form an amide bond will be described below.

As the above nitrogen-containing compound, an appropriate compound is selected in consideration of all of the properties required for the compound such as the solubility of its salt or amide compound in an organic solvent and developing solution, the ability to form a salt, the absorbance and chromatic value of its dye, the interaction with other components in the curable composition, the heat resistance and light fastness as a colorant. When the nitrogen-containing compound is selected only from the viewpoint of the absorbance and chromatic value, compounds having as low a molecular weight as possible are preferable. Particularly, compounds having a molecular weight of 300 or less are preferable, compounds having a molecular weight of 280 or less are more preferable and compounds having a molecular weight of 250 or less are still more preferable.

The molar ratio n of the nitrogen-containing compound/the acid dye in the salt of the acid dye and nitrogen-containing compound is a value determining the molar ratio of an acid dye molecule to an amine compound which is a counter ion, and may be freely selected according to the condition under which a salt of the acid dye-amine compound is formed. Specifically, as the molar ratio n, an appropriate value which corresponds to the number of functional groups of the acid in the acid dye and satisfies $0<n\leq5$, is adopted in many actual practices, and is selected in consideration of all of the properties required for the composition such as the solubility of its salt or amide compound in an organic solvent and developing solution, ability to form a salt, absorbance, interaction with other components in the curable composition, light fastness and heat resistance. In the case of selecting only from the viewpoint of the absorbance, the above n preferably has a value satisfying $0<n\leq4.5$, more preferably $0<n\leq4$ and still more preferably $0<n\leq3.5$.

Since the introduction of an acid group structurally allows the compound to function as the acid dye, the acid dye can be transformed to a non-acidic dye by changing its substituent.

Although the acid dye well acts in alkali developing, it may bring about over development on the other hand, and in some cases, it may be preferred that the non-acid dye is used. As this non-acid dye, dyes obtained by removing an acid group from the above exemplified acid dyes are preferably used.

Examples of the pigment which may be mixed with the triarylmethane-based dye contained in the blue color composition according to this embodiment may include blue pigments such as C.I. Pigment Blue 15, 15:1, 15:2, 15:3, 15:4, 15:6, 16, 22, 60, 64 and 80 and preferably C.I. Pigment Blue 15:6.

Also, in the blue color composition according to this embodiment, violet pigments such as C.I. Pigment Violet 1, 19, 23, 27, 29, 30, 32, 37, 40, 42 and 50 and preferably C.I. Pigment Violet 23 may be used together.

The blue color composition according to this embodiment may contain, on an as needed, a binder resin, curable resin, monomer, photopolymerization initiator and organic solvent besides the dye and pigment explained above. The blue color composition may also contain a sensitizer and leveling agent.

A color filter according to a second embodiment of the present invention is provided with a blue pixel obtained by curing the blue color composition according to the first embodiment of the present invention as mentioned above.

The color filter according to this embodiment may be, on an as needed, provided with a red pixel and a green pixel besides the blue pixel, and on an as needed, further with other color pixels such as a yellow pixel, a cyan pixel, a magenta pixel and a transparent pixel. Color pixels other than the blue pixel may be formed by using known color compositions containing a color pigment and/or a color dye.

In the color filter according to this embodiment, the blue pixel has a film thickness of preferably 0.1 μm to 5.0 μm, more preferably 0.5 μm to 4.0 μm, and still more preferably 1.0 μm to 3.0 μm. This is because, when the blue pixel according to the present invention is formed by the photolithographic method, it may become difficult to form a pixel if the film thickness is less than 0.1 μm, whereas if the film thickness exceeds 5 μm, it may become difficult to form a coating film of the composition by application.

The color filter according to this embodiment comprises a blue pixel made of a blue color coating film formed using the above blue color composition for color filter, on a transparent substrate. The color filter generally comprises a green pixel and a red pixel formed using known color compositions besides the blue pixel.

Figure 1:
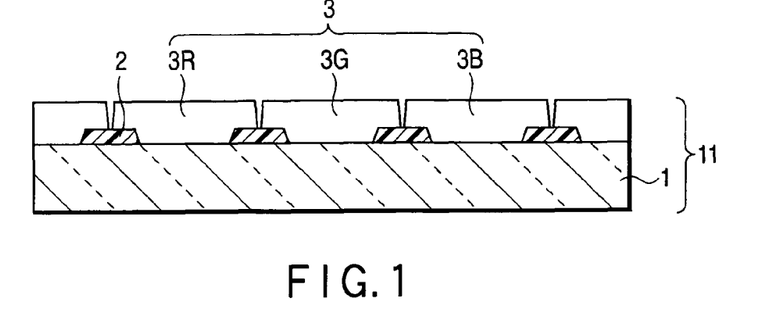
FIG. 1 is a sectional view showing a color filter according to a second embodiment of the present invention.

Specifically, as shown in FIG. 1, the color filter comprises a black matrix 2 which is a light-shielding film, and a color pixel 3, on a transparent substrate 1 formed of glass or the like. The color pixel 3 comprises a blue pixel 3B formed using the aforementioned blue color composition, a red pixel 3R and a green pixel 3G.

As the transparent substrate, a glass plate made of, for example, soda lime glass, low-alkali borosilicate glass or non-alkali alumino-borosilicate glass and a resin plate made of, for example, polycarbonate, poly-methylmethacrylate or polyethylene terephthalate are used. Also, when the color filter according to this embodiment is incorporated into a liquid crystal display device, a transparent electrode made of, for example, indium oxide or tin oxide may be formed on the surface of the glass plate or resin plate to drive the liquid crystal display device.

Each color pixel may be formed by, for example, the printing method, ink jet method or photolithographic method.

The formation of each color pixel by using the printing method is accomplished at low costs and is also excellent in mass-productivity as the method of producing a color filter because patterning can be made only by repeating the printing and drying of each color composition prepared as the above various printing inks. Also, the development of printing technologies makes it possible to print fine patterns having high dimensional accuracy and high smoothness. In order to carry out printing, the ink preferably has a composition prevented from being dried and solidified on a printing plate or a blanket. Also, it is important to control the fluidity of ink in a printer, and the viscosity of the ink can be adjusted by using a dispersant or extender pigment.

As the method of producing a color filter by using the ink jet method, a method is proposed in which a black matrix is formed on a glass substrate and ink is applied to an opening of the black matrix by using an ink jet printer to form a color part. Moreover, in this method, a water-repellent material such as a fluorine compound or silicon compound may be contained in a material constituting the black matrix in order to fill the ink in the prescribed opening exactly, thereby preventing a color mixture produced when inks are mixed between adjacent color parts.

As a device used for ink jet, there are the piezo conversion method and thermal conversion method which differ in method of jetting ink. Also, the frequency for the granulation of ink in the ink jet device is about 5 to 100 KHz. Also, the diameter of a nozzle in the ink jet device is preferably about 5 to 80 μm. The ink jet device may be provided with plural heads, into each of which about 60 to 500 nozzles are incorporated.

After a color pattern is formed by the ink jet method, a convection oven, IR oven or hot plate is used to carry out heat treatment, thereby forming a color layer pattern. The ink jet method ensures that a color filter can be produced by a simple process at low costs because plural color inks can be applied simultaneously.

Where each color pixel is formed by the photolithographic method, the aforementioned color composition prepared as a solvent developing type or alkali developing type resist is applied to a transparent substrate by a coating method such as spray coating, spin coating, slit coating or roll coating such that the film thickness of the dried coating film is 0.2 to 10 μm. Drying of the coating film can be carried out by a vacuum dryer, convection oven, IR oven or hot plate. The film dried as required is exposed to ultraviolet light through a photomask having a predetermined pattern, which is disposed in contact or noncontact with the film.

Then, the substrate is dipped in a solvent, or alkali developing solution or a developing solution is sprayed onto the substrate to remove uncured parts, thereby forming a desired pattern. Then, the same operations are repeated by using other color inks to produce a color filter.

In this case, the patterned colored resist may be heated on an as needed after developed to promote the polymerization of the color resist. According to the photolithographic method, a color filter can be produced with high accuracy by the above printing method.

When the layer of the color composition is developed, an aqueous solution of sodium carbonate or sodium hydroxide is used as the alkali developing solution. In this case, an organic alkali such as dimethylbenzylamine and triethanolamine may be used. Also, an antifoaming agent and surfactant may be added to the developing solution. As the developing method, for example, the shower developing method, spray developing method, dip developing method or paddle developing method may be applied.

In this case, in order to increase the sensitivity of the film in the exposure to ultraviolet rays, after the above color resist is applied and dried, a water-soluble or alkali-soluble resin, for example, a polyvinyl alcohol or water-soluble acrylic resin may be applied and dried to form a film preventing inhibition of polymerization caused by oxygen.

The color filter according to this embodiment may be produced by the electrodeposition method or transfer method besides the above methods. In this case, the electrodeposition method is a method in which colloid particles are deposited on a transparent conductive film formed on a transparent substrate by electrodeposition to form each color pixel, thereby producing a color filter.

In the transfer method, a color pixel is formed in advance on the surface of a peelable transfer base sheet or transfer drum and then, this color pixel is transferred to a desired transparent substrate.

If a black matrix is formed in advance before each color pixel is formed on a transparent substrate or reflecting substrate, the contrast of the display panel can be further improved. As the black matrix, a chromium film, a multilayer film of chromium/chromium oxide, or inorganic film of titanium nitride or the like, or a resin film in which a light-shielding agent is dispersed may also be used.

Also, when a color filter according to this embodiment is incorporated into a liquid crystal display device, a thin film transistor (TFT) may be formed in advance on the above transparent substrate or reflecting substrate and then, a color pixel may be formed thereon. The aperture ratio and brightness of the liquid crystal display panel can be improved by forming color pixels on a TFT substrate.

An overcoat film, a columnar spacer, a transparent conductive film and a liquid crystal orientation film may be formed, if necessary, on the color filter according to this embodiment.

The color filter according to this embodiment can be preferably used in a liquid crystal display device, an organic EL device and an organic EL display device.

When the color filter according to this embodiment is used in a liquid crystal display device, the XYZ colorimetric system chromaticity coordinates in CIE1394 which are obtained by measuring the spectral transmittance of the blue color layer and calculating based on illumination with a C light source are preferably designed to be as follows: $0.12 \leq x \leq 0.18$, $0.08 \leq y \leq 0.18$ and $Y \geq 13$. The coordinates are more preferably as follows: $0.13 \leq x \leq 0.17$, $0.09 \leq y \leq 0.17$ and $Y \geq 15$. The coordinates are still more preferably as follows: $0.13 \leq x \leq 0.16$, $0.09 \leq y \leq 0.16$ and $Y \geq 16$.

The reason for this is as follows. Specifically, when the value of x is less than the above range, the color may become too heavy, leading to low transmittance whereas when the value of x exceeds the above range, too high a tinge of red may be obtained, so that a clear blue color may not be expressed, bringing about reduced color reproducibility. Also, when the value of y is less than the above range, the color may become too heavy, leading to low transmittance whereas when the value of y exceeds the above range, the tinge is close to cyan, so that a clear blue color may not be expressed, bringing about reduced color reproducibility. Also, when the value of Y is less than the above range, too heavy color may be obtained, so that the transmittance may be low, bringing about dark pixels, whereas when the value if Y exceeds the above range, a pale color may be obtained, resulting in insufficient color reproducibility.

When the color filter according to this embodiment is used for an organic EL device or organic EL display device, the spectral transmittance of the blue pixel is preferably 10% or less at 600 nm and 90% or more at 450 nm. The spectral transmittance is more preferably 5% or less at 600 nm and 95% or more at 450 nm, and still more preferably 2% or less at 600 nm and 95% or more at 450 nm.

A liquid crystal display device according to a third embodiment of the present invention comprises the above color filter.

Figure 2:
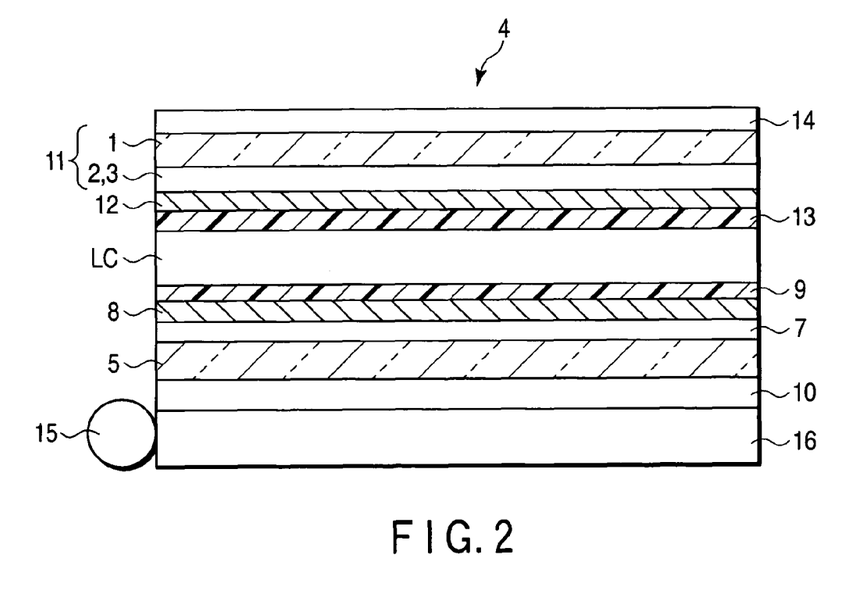
FIG. 2 is a sectional view showing an example of a liquid crystal display device comprising the color filter shown in FIG. 1.

FIG. 2 is a sectional view schematically showing the liquid crystal display device according to this embodiment. In FIG. 2, a liquid crystal display device 4 comprises a pair of transparent substrates 5 and 1 which are disposed apart from and opposite to each other, and a liquid crystal (LC) is sealed between these substrates.

A TFT (thin film transistor) array 7 is formed on the inside surface of the first transparent substrate 5 and a transparent electrode layer 8 made of, for example, ITO is formed on the TFT array 7. An alignment layer 9 is formed on the transparent electrode layer 8. A polarizing plate 10 including a retardation film structurally is formed on the outside surface of the transparent substrate 5.

On the other hand, the second transparent substrate 1 is a transparent substrate constituting a color filter 11. As shown in FIG. 2, a black matrix 2 and a color pixel 3 are formed on the inside surface of the transparent substrate 1 facing the liquid crystal (LC) as mentioned above to constitute the color filter 11. A transparent protective film (not shown) is formed so as to cover the color filter 11 on an as needed and a transparent electrode layer 12 made of, for example, ITO is formed on the transparent protective film. An alignment layer 13 covering the transparent electrode layer 12 is formed. Also, a polarizing plate 14 is formed on the outer surface of the transparent substrate 1. In this case, a backlight unit 16 comprising a three-wavelength lamp 15 is disposed under the polarizing plate 10.

An organic EL display device according to a fourth embodiment of the present invention comprises the aforementioned color filter.

Figures 3A, 3B:
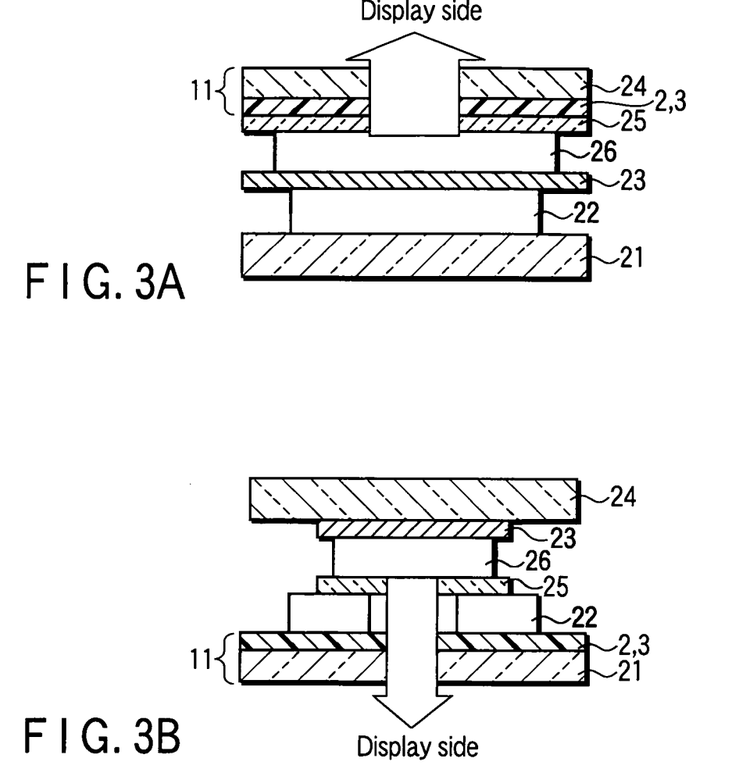
FIGS. 3A, 3B and 3C are sectional views showing various examples of EL display devices comprising the color filter shown in FIG. 1.
Figure 3C:
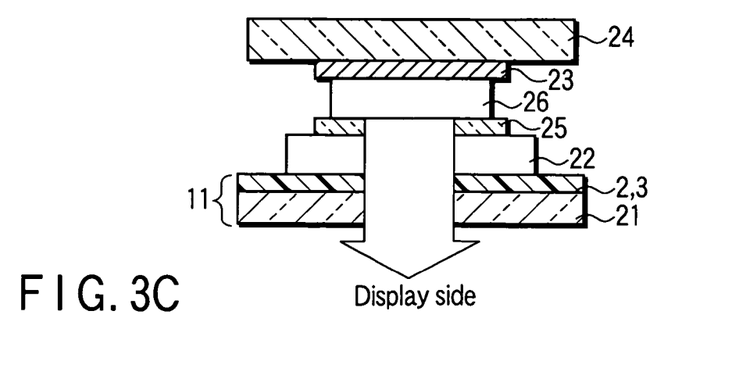

As the structure of the organic EL display device, there are three types as shown in FIGS. 3A to 3C.

A first type is, as shown in FIG. 3A, a top emission type in which a light-emitting layer (organic EL layer) 26 is sandwiched between a metal electrode 23 electrically connected to a TFT array 22 formed on a transparent substrate 21 and a transparent electrode 25 formed on a sealing substrate 24 facing the transparent substrate 21 to extract the light emitted from the light-emitting layer from the sealing substrate side when voltage is applied across both electrodes.

A second type is, as shown in FIGS. 3B and 3C, a bottom emission type in which the positions of the metal electrode 23 and transparent electrode 25 are exchanged to extract the light from the TFT array side 22.

Also, as a system for extracting light, the following three systems are proposed. Specifically, in a first system, the light emitted from the light-emitting layer 26 is extracted as white light as it is.

In a second system, blue light is emitted from the light-emitting layer 26 to extract this blue light as it is and also, a part of the blue emitted light is made to be incident on a G (green) conversion layer and to an R (red) conversion layer (not shown) provided on the light-emitting layer 26 to also extract G-color light and R-color light. In a third system, a light-emitting layer that emits red light, a light-emitting layer that emits green light and a light-emitting layer that emits blue light are each formed to extract these three color lights.

In the organic EL color display device, color pixels 3 of R, G and B and as required, the black matrix 2 are formed on the sealing substrate 24 to form the color filter 11 and the extracted light is made to pass through the color filter, whereby light (color light) having a desired wavelength range can be obtained in the first system for extracting white light.

Also, in the above second system using a conversion layer and the third system in which three color light-emitting layers are formed, the colorization of display image can be accomplished somehow by controlling the emission of each color. However, the spectral characteristics of the light obtained in such a system are different from the spectral characteristics of the color light desired for color indication. For this reason, in the case of the color light extracted in such a system, it is also necessary that color pixels 3 of R, G and B and, as required, the black matrix 2 be formed on the transparent substrate 21 to form the color filter 11 and the color light is made to pass through the color filter to thereby prepare color light having desired spectral characteristics.

EXAMPLES

The present invention will be explained in more detail by way of Examples and Comparative Examples, which are not intended to limit the present invention. In these examples, all designations of parts and % indicate parts by weight and weight percentage (wt. %), respectively, unless otherwise noted. Also, the symbols of the pigments show color index numbers and, for example, "PB15:6" represents "C.I. Pigment Blue 15:6" and "PV23" represents "C.I. Pigment Violet 23".

Examples of the production of dyes and pigments will be explained.

a) Production of a Dye

Production Example 1

2 parts of a blue dye (C.I. Basic Blue 7, manufactured by Tokyo Chemical Industry Co., Ltd.) was dissolved in 150 parts of water to form a blue dye aqueous solution and a solution obtained by dissolving 2.1 parts of a cesium salt of tristrifluoromethanesulfoniummethide in 30 parts of acetonitrile was added to the blue dye aqueous solution with stirring. After stirring the mixture for 3 hours, the precipitated crystals were collected by filtration, washed with water and dried to obtain 1.5 parts of blue crystals.

b) Production of a Pigment

Production Example 1

Blue Pigment

A stainless one-gallon kneader (manufactured by INOUE MANUFACTURING CO., LTD.) was charged with 200 parts of a blue pigment (trade name: "LIONOL BLUE ES"; B-1, C.I. Pigment Blue 15:6, manufactured by TOYO INK MFG. Co., Ltd.), 1600 parts of sodium chloride and 100 parts of diethylene glycol (manufactured by Tokyo Chemical Industry Co., Ltd.) and the mixture was kneaded at 70° C. for 12 hours. Next, this mixture was poured into about 5 l of warm water, which was then stirred by a high-speed mixer under heating at about 70° C. for about 1 hour to make a slurry. This slurry was then subjected to filtration and the residue was washed with water to remove sodium chloride and diethylene glycol. The obtained residue was dried at 80° C. for 24 hours to obtain 198 parts of salt milling treated pigment (blue pigment).

Production Example 2

Violet Pigment 300 parts of a violet pigment (trade name: "LIONOGEN VIOLET RL"; V-1, C.I. Pigment Violet 23, manufactured by TOYO INK MFG. Co., Ltd.) was poured into 3000 parts of 96% sulfuric acid, and the mixture was stirred for 1 hour and was then poured into 5° C. water. After the mixture was stirred for 1 hour, it was subjected to filtration and the residue was washed with warm water until the washing solution became neutral, followed by drying at 70° C. A stainless one-gallon kneader (manufactured by INOUE MANUFACTURING CO., LTD.) was charged with 200 parts of the obtained acid-pasted pigment, 1600 parts of sodium chloride and 100 parts of diethylene glycol (manufactured by Tokyo Chemical Industry Co., Ltd.) and the mixture was kneaded at 90° C. for 6 hours.

Next, this mixture was poured into about 5 l of warm water, which was then stirred by a high-speed mixer under heating at about 70° C. for about 1 hour to make a slurry. This slurry was then subjected to filtration and the residue was washed with water to remove sodium chloride and diethylene glycol. The obtained residue was dried at 80° C. for 24 hours to obtain 198 parts of salt milling treated pigment (ultraviolet pigment).

c) Production of an Acrylic Resin Solution (P)

The preparation of acrylic resin solutions used in examples and comparative examples will be described below. The molecular weight of the resins are each a weight average molecular weight based on polystyrene. The weight average molecular weight was measured by GPC (gel permeation chromatography).

370 parts of cyclohexanone was placed in a reactor, which was then heated to 80° C. while introducing nitrogen into the reactor, and a mixture of 20.0 parts of methacrylic acid, 10.0 parts of methylmethacrylate, 55.0 parts of n-butylmethacrylate, 15.0 parts of 2-hydroxyethylmethacrylate and 4.0 parts of 2,2'-azobisisobutyronitrile was added dropwise to the reactor also at 80° C. over 1 hour to undergo a polymerization reaction.

After the dropwise addition was finished, the reaction mixture was further reacted at 80° C. for 3 hours and then, a solution prepared by dissolving 1.0 part of azobisisobutyronitrile in 50 parts of cyclohexanone was added to the mixture which was further reacted at 80° C. for 1 hour to obtain an acrylic resin solution. The weight average molecular weight of the acrylic resin was about 40,000.

After the resin solution was cooled to ambient temperature, about 2 g of the resin solution was sampled and dried under heating at 180° C. for 20 minutes to measure the content of nonvolatile components. Then, cyclohexanone was added to the previously synthesized resin solution such that the content of nonvolatile components was 20% by weight to prepare an acrylic resin solution (P).

d) Production of a Pigment Dispersion

A mixture having the composition shown in Table 1 was uniformly mixed with stirring and then dispersed by an Eiger Mill (trade name: "MINIMODEL M-250 MKII", manufactured by Eiger Japan Co., Ltd.) for 3 hours and then subjected to filtration using a 5 μm filter to obtain pigment dispersions BP-1 and VP-1. The content of the pigment in each pigment dispersion is described together in Table 1 below.

TABLE 1

| Pigment dispersion | | BP-1 | VP-1 |
|---|---|---|---|
| Pigment | Pigment | B-1 | V-1 |
| Composition | Pigment | 10.0 | 10.0 |
| | Dispersant | 2.0 | 2.0 |
| | Acrylic resin solution | 40.0 | 40.0 |
| | Organic solvent | 48.0 | 48.0 |
| | Total | 100.0 | 100.0 |

In this case, a compound represented by the following formula (2) was used as the dispersant.

Cu—cp; Copper phthalocyanine residue e) Preparation of a Blue Color Composition

Example 1

A mixture having the following composition was uniformly mixed with stirring and then, filtered by a 5 μm filter to obtain a blue color composition RB-2 containing only BD-1 as a colorant.

| | |
|---|---|
| Dye (BD-1) | 0.8 parts by weight |
| Acrylic resin solution (P) | 38.4 parts by weight |
| Photopolymerizable monomer (trade name: "ARONIX M402", manufactured by Toagosei Co., Ltd.) | 7.7 parts by weight |
| Photopolymerization initiator (trade name: "IRGACURE-379", manufactured by Ciba-Geigy Corp.) | 3.4 parts by weight |
| Photosensitizer (trade name: "EAB-F", manufactured by Hodogaya Chemical Co., Ltd.) | 0.4 parts by weight |
| Cyclohexanone | 49.3 parts by weight |

Examples 2 to 5, Comparative Examples 1 to 6

Color compositions RB-1, RB-3 to RB-5 (Examples 2 to 5), RB-6 to RB-8 and RB-10 to RB-12 (Comparative Examples 1 to 6) were obtained in the same manner as in Example 1 except that as the dye, pigment dispersion and resin, those described in Table 2 below were used. In Table 2, RB-2 according to Example 1 is also shown.

RB-1 is an example (Example 3) which contains only BD-1 as the colorant but is changed in the amount of BD-1, RB-3 is an example (Example 2) which contains, as the colorant, BD-1 and BD-2 (C.I. Solvent Blue 35 (trade name: Kayaset Blue N, manufactured by Nippon Kayaku Co., Ltd.)) which is other dye out of the scope of the present invention, RB-4 is an example (Example 4) containing BD-1 and a pigment as the colorant and RB-5 is an example (Example 5) containing BD-1 and two kinds of pigments as the colorant.

Also, RB-6 is an example (Comparative Example 1) which contains only BD-1 as the colorant but the amount of BD-1 is smaller, RB-7 is an example (Comparative Example 2) containing only BD-3 (C.I. Basic Blue 7, manufactured by Tokyo Chemical Industry Co., Ltd.) which is other dye out of the scope of the present invention as the colorant, RB-8 is an example (Comparative Example 4) obtained by increasing the amount of BD-3 as the colorant in RB-7, RB-10 is an example (Comparative Example 5) containing BD-3 and a pigment as the colorant, RB-11 is an example (Comparative Example 6) containing only a pigment as the colorant and RB-12 is an example (Comparative Example 3) obtained by reducing the pigment in RB-11.

TABLE 2

| | RB-1 | RB-2 | RB-3 | RB-4 | RB-5 | RB-6 | RB-7 | RB-8 | RB-9 | RB-10 | RB-11 | RB-12 |
|---|---|---|---|---|---|---|---|---|---|---|---|---|
| Dye 1 | BD-1 | BD-1 | BD-1 | BD-1 | BD-1 | BD-1 | BD-3 | BD-3 | BD-4 | BD-3 | | |
| Dye 2 | | | BD-2 | | | | | | | | | |
| Pigment dispersion 1 | | | | BP-1 | BP-1 | | | | | BP-1 | BP-1 | BP-1 |
| Pigment dispersion 2 | | | | | VP-1 | | | | | | | |
| Composition Dye 1 | 3.2 | 0.8 | 0.6 | 2.0 | 1.6 | 0.4 | 0.8 | 3.2 | 0.8 | 2.0 | | |
| Dye 2 | | | 0.2 | | | | | | | | | |
| Pigment dispersion 1 | | | | 16.7 | 10.7 | | | | | 16.7 | 43.3 | 18.3 |
| Pigment dispersion 2 | | | | | 2.7 | | | | | | | |
| Acrylic resin solution | 33.6 | 38.4 | 38.4 | 25.4 | 28.5 | 39.2 | 38.4 | 33.6 | 38.4 | 25.4 | 12.3 | 28.3 |
| Monomer | 6.7 | 7.7 | 7.7 | 6.4 | 6.7 | 7.8 | 7.7 | 6.7 | 7.7 | 6.4 | 5.9 | 7.1 |
| Photopolymerization initiator | 3.0 | 3.4 | 3.4 | 2.8 | 3.0 | 3.5 | 3.4 | 3.0 | 3.4 | 2.8 | 2.6 | 3.2 |
| Sensitizer | 0.4 | 0.4 | 0.4 | 0.4 | 0.4 | 0.4 | 0.4 | 0.4 | 0.4 | 0.4 | 0.4 | 0.4 |
| Organic solvent | 53.1 | 49.3 | 49.3 | 46.3 | 46.5 | 48.6 | 49.3 | 53.1 | 49.3 | 46.3 | 35.5 | 42.7 |
| Total | 100.0 | 100.0 | 100.0 | 100.0 | 100.0 | 100.0 | 100.0 | 100.0 | 100.0 | 100.0 | 100.0 | 100.0 | f) Measurement of Various Properties (Chromaticity and Transmittance)

Each of the blue color compositions RB-1 to RB-12 was applied to a glass substrate by the spin coating method such that the thickness of the cured film was 2 μm, dried and then exposed to ultraviolet rays by using a high-pressure mercury lamp. After that, this substrate was heat-treated at 180° C. for 20 minutes to obtain a blue color film.

The spectral transmittance of this blue color film was measured using microscopic spectral photometer (trade name: "OSP-SP100", manufactured by OLYMPUS CORPORATION) to calculate the chromaticity (Y, x, y) based on illumination from a C light source.

(Production of a Coating Film of a Color Composition)

Each of the blue color compositions shown in the above Table 2 was applied to a glass substrate by the spin coating method and then prebaked at 70° C. for one minute in a clean oven. Then, this substrate was cooled to ambient temperature and then the entire surface of the blue color composition film was exposed to ultraviolet light by using a ultra-high pressure mercury lamp. After that, this blue color composition film was developed by spraying a 23° C. aqueous sodium carbonate solution, then washed with ion exchange water and dried in air. Then, the substrate was post-baked at 180° C. for 20 minutes in a clean oven to obtain a blue coating film. The film thickness of each dried coating film was 2.0 μm.

(Evaluation of Heat Resistance)

The heat resistance of the color composition shown in the above Table 2 was evaluated in the following manner.

Specifically, the color composition was used to form a coating film by the above method and baked for 1 hour in a clean oven. The baking process was carried out at 150° C., 180° C. and 200° C. Each chromaticity before and after the baking process was measured by the above method to calculate a color difference ΔEab (C) between the chromaticities measured before and after the baking process. If the color difference was less than 5.0, this was rated as "○". If the color difference was 5.0 or more and less than 8.0, this was rated as "Δ". If the color difference was 8.0 or more, this was rated as "X".

(Evaluation of Light Fastness)

The sensitivity of each blue color composition shown in the above Table 2 was evaluated in the following manner.

Specifically, the obtained light-sensitive composition was first applied to the surface of a glass substrate by the spin coating method and then prebaked at 70° C. for one minute to form a coating film having a film thickness of 2.5 μm. Then, the coating film was exposed to ultraviolet light through a photomask provided with a 50 μm fine pattern by the proximity exposure system using ultraviolet light as the exposure light source. The dose of light was designed to be 100 mJ/cm².

Next, the coating film was developed by a shower of a 1.25 wt % sodium carbonate solution, then washed with water and heat-treated at 230° C. for 20 minutes to complete patterning. 1.0-μm-thick polyvinyl alcohol was applied to this patterned substrate as an oxygen blocking layer. This substrate was exposed to light for 100 hours by using a xenon feather meter (trade name: Ci-35 WEATHER-OMETER, TOYOSEIKISEISAKUJYO, illuminance: 0.5 mW, wavelength: 340 nm) to calculate a color difference ΔEab (C) between the chromaticities measured before and after the exposure process. If the color difference was less than 5.0, this was rated as "○". If the color difference was 5.0 or more and less than 8.0, this was rated as "Δ". If the color difference was 8.0 or more, this was rated as "X".

The results of the measurements of each property are shown in Tables 3 and 4 below.

TABLE 3

|  |  | Example 1 | Example 2 | Comparative Example 1 | Comparative Example 2 | Comparative Example 3 |
|---|---|---|---|---|---|---|
| Resist |  | RB-2 | RB-3 | RB-6 | RB-7 | RB-12 |
| Transmittance | 600 nm | 2.0 | 2.0 | 2.0 | 2.0 | 2.0 |
| Transmittance | 450 nm | 99.0 | 98.6 | 98.4 | 98.6 | 94.4 |
| Film thickness of pixel pattern [μm] |  | 2.2 | 2.2 | 4.5 | 2.0 | 2.2 |
| Heat resistance (1 hour) |  |  |  |  |  |  |
| ΔEab(C.) | 150° C. | ○ | ○ | ○ | X | ○ |
|  | 180° C. | ○ | ○ | ○ | X | ○ |
|  | 200° C. | Δ | ○ | ○ | X | ○ |
| Light fastness |  |  |  |  |  |  |
| ΔEab(C.) | 100 hour | ○ | ○ | ○ | X | ○ |

It is found from the above Table 3 that the samples according to Examples 1 and 2 using a triarylmethane-based dye represented by the above formula (1) are each superior in heat resistance and light fastness. It is also found that these samples respectively have a high transmittance at 450 nm and are therefore particularly preferable as a color filter for EL display devices.

On the other hand, the sample according to Comparative Example 2 using a different triarylmethane-based dye is inferior in heat resistance and light fastness. The sample according to Comparative Example 3 using a blue pigment has excellent heat resistance and light fastness, but has a low transmittance (maximum transmittance) at 450 nm. Also, the sample according to Comparative Example 1 containing a triarylmethane-based dye represented by the formula (1) in a low concentration has a large film thickness and is reduced in productivity, giving difficulties in practical use.

TABLE 4

|  |  | Example 3 | Example 4 | Example 5 | Comparative Example 4 | Comparative Example 5 | Comparative Example 6 |
|---|---|---|---|---|---|---|---|
| Resist |  | RB-1 | RB-4 | RB-5 | RB-8 | RB-10 | RB-11 |
| Chromaticity | x | 0.139 | 0.136 | 0.142 | 0.138 | 0.139 | 0.134 |
| (C light source) | y | 0.112 | 0.111 | 0.114 | 0.112 | 0.112 | 0.112 |
|  | Y | 16.4 | 15.2 | 15.2 | 16.3 | 16.4 | 13.9 |

TABLE 4-continued

| | | Example 3 | Example 4 | Example 5 | Comparative Example 4 | Comparative Example 5 | Comparative Example 6 |
|---|---|---|---|---|---|---|---|
| Film thickness of pixel pattern [μm] | | 2.4 | 2.4 | 2.2 | 2.4 | 2.4 | 2.4 |
| Heat resistance (1 hour) | | | | | | | |
| ΔEab(C.) | 150° C. | ○ | ○ | ○ | X | Δ | ○ |
| | 180° C. | ○ | ○ | ○ | X | X | ○ |
| | 200° C. | Δ | ○ | ○ | X | X | ○ |
| Light fastness | | | | | | | |
| ΔEab(C.) | 100 hours | ○ | ○ | ○ | X | X | ○ |

It is found from the above Table 4 that the samples according to Examples 3 to 5 using a triarylmethane-based dye represented by the above formula (1) are all superior in heat resistance and light fastness. Also, it is found that these samples each have a chromaticity falling in a predetermined range and are therefore particularly preferable for color filters used in liquid crystal display devices.

On the other hand, the samples according to Comparative Examples 4 and 5 using different triarylmethane-based dyes are each deteriorated in heat resistance and light fastness. The sample according to Comparative Example 6 using a blue pigment has excellent heat resistance and light fastness, but has a low Y in the chromaticity, and presents difficulties in use as color filters of liquid crystal display devices.

(Production of a Liquid Crystal Panel)

A color filter comprising a blue pixel obtained using the blue color composition according to Example 3 was produced, a transparent ITO electrode layer was formed on the color filter and further, a polyimide alignment layer was formed on the electrode layer. A polarizing plate was formed on the other surface of this glass substrate. In the meantime, a TFT array and a pixel electrode were formed on one surface of a separate (second) glass substrate and a polarizing plate was formed on the other surface of the glass substrate.

These two glass substrates prepared in this manner were disposed opposite to each other such that the electrode layers face each other and were aligned with each other while keeping a constant space between the both by using space beads to seal the periphery by a sealing agent so as to leave an opening part for injecting a liquid crystal composition. A liquid crystal composition was injected from the opening part to seal the opening part. The liquid crystal display device manufactured in this manner was combined with a backlight unit to obtain a liquid crystal panel.

The resulting liquid crystal panel exhibited excellent heat resistance and light fastness.

(Production of EL Panel)

A color filter comprising a blue pixel obtained using the blue color composition according to Example 1 was produced. An EL panel was manufactured using this color filter.

The resulting EL panel exhibited excellent heat resistance and light fastness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dye-containing blue color composition for color filter, comprising a triarylmethane-based dye having a structure represented by the following formula (1):

wherein $R_1$, $R_2$, $R_3$, $R_4$, $R_5$ and $R_6$ each independently represent a hydrogen atom, an alkyl group having 1 to 6 carbon atoms which may have a substituent, a phenyl group which may have a substituent or a benzyl group which may have a substituent, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ each independently represent a hydrogen atom, an alkyl group having 1 to 6 carbon atoms which may have a substituent or a halogen atom and X represents a tristrifluoromethanesulfonylmethide anion.

2. The dye-containing blue color composition according to claim 1, wherein $R_1$, $R_2$, $R_3$, $R_4$, $R_5$ and $R_6$ in the formula (1) each independently represent a hydrogen atom, an unsubstituted alkyl group having 1 to 6 carbon atoms, an unsubstituted phenyl group or an unsubstituted benzyl group, and $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$ and $R_{20}$ each independently represent a hydrogen atom, a chlorine atom or an unsubstituted alkyl group having 1 to 6 carbon atoms.

3. The dye-containing blue color composition according to claim 1, wherein a concentration by weight of the triarylmethane-based dye in the blue color composition is 0.1% to 20%.

4. A color filter comprising a blue pixel obtained by curing the dye-containing blue color composition according to claim 1.

5. The color filter according to claim 4, wherein the blue pixel has a film thickness of 0.1 μm to 5.0 μm.

6. A liquid crystal display device comprising the color filter according to claim 4, wherein an XYZ colorimetric system chromaticity of the blue pixel satisfies $0.12 \leq x \leq 0.18$, $0.08 \leq y \leq 0.18$ and $Y \geq 13$.

7. A liquid crystal display device comprising the color filter according to claim 5, wherein an XYZ colorimetric system chromaticity of the blue pixel satisfies $0.12 \leq x \leq 0.18$, $0.08 \leq y \leq 0.18$ and $Y \geq 13$.

8. An organic EL display device comprising the color filter according to claim 4, wherein transmittance of the blue pixel is 10% or less at 600 nm and 90% or more at 450 nm.

9. An organic EL display device comprising the color filter according to claim 5, wherein transmittance of the blue pixel is 10% or less at 600 nm and 90% or more at 450 nm.

* * * * *